(12) United States Patent  
Park et al.

(10) Patent No.: US 11,923,709 B2  
(45) Date of Patent: Mar. 5, 2024

(54) ELECTRONIC DEVICE INCLUDING ANTENNA MEMBER FOR WIRELESS CHARGING

(71) Applicant: Samsung Electronics Co., Ltd., Suwon-si (KR)

(72) Inventors: Sungtae Park, Suwon-si (KR); Minki Kim, Suwon-si (KR); Kicheol Bae, Suwon-si (KR); Yongjae Song, Suwon-si (KR); Hyelim Yun, Suwon-si (KR); Woosung Jang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 175 days.

(21) Appl. No.: 17/551,793

(22) Filed: Dec. 15, 2021

(65) Prior Publication Data

US 2022/0302722 A1    Sep. 22, 2022

Related U.S. Application Data

(63) Continuation of application No. PCT/KR2021/018885, filed on Dec. 13, 2021.

(30) Foreign Application Priority Data

Mar. 18, 2021  (KR) .................. 10-2021-0035093

(51) Int. Cl.  
*H05K 1/11* (2006.01)  
*H01Q 7/00* (2006.01)  
(Continued)

(52) U.S. Cl.  
CPC ............ *H02J 7/0042* (2013.01); *H01Q 7/00* (2013.01); *H02J 50/10* (2016.02); *H05K 1/11* (2013.01);  
(Continued)

(58) Field of Classification Search  
CPC ... H05K 1/11; H05K 1/14; H05K 1/18; H05K 1/144; H05K 1/181–187; H05K 3/284;  
(Continued)

(56) References Cited

U.S. PATENT DOCUMENTS 5,748,455 A * 5/1998 Phillips .................... H04B 1/38  
361/753  
9,753,501 B2 * 9/2017 Heo ...................... G06F 1/1688  
(Continued)

FOREIGN PATENT DOCUMENTS

JP          2014-011852 A     1/2014  
KR    10-2012-0128576 A    11/2012  
(Continued)

OTHER PUBLICATIONS

International Search Report dated Mar. 11, 2022, issued in International Application No. PCT/KR2021/018885.

*Primary Examiner* — Tuan T Dinh  
(74) *Attorney, Agent, or Firm* — Jefferson IP Law, LLP

(57) ABSTRACT

An electronic device is provided. The electronic device includes a first circuit board, an antenna member disposed to face one surface of the first circuit board, an electronic module disposed between the first circuit board and the antenna member and including a plurality of contact protrusions disposed to face the antenna member, and a plurality of contact members disposed on the antenna member and configured to electrically contact one of the plurality of contact protrusions. As the antenna member generates an induced current in reaction to an external electrical signal or an external electromagnetic field, the electronic module may be configured to supply power using the induced current generated by the antenna member.

20 Claims, 8 Drawing Sheets

(51) Int. Cl.
    *H02J 7/00*     (2006.01)
    *H02J 50/10*    (2016.01)
    *H05K 1/14*     (2006.01)
    *H05K 1/18*     (2006.01)
    *H05K 5/00*     (2006.01)

(52) U.S. Cl.
    CPC ............. H05K 1/144 (2013.01); H05K 1/181 (2013.01); H05K 5/0086 (2013.01); H05K 2201/10734 (2013.01)

(58) Field of Classification Search
    CPC ........ H05K 5/00; H05K 5/0086; G06F 1/163; G06F 1/626; G06F 1/698
    USPC .................. 361/770–795, 814, 816, 818; 257/659–690
    See application file for complete search history.

(56) References Cited

U.S. PATENT DOCUMENTS

| | | |
|---|---|---|
| 10,477,675 B1 | 11/2019 | Kim et al. |
| 2015/0062847 A1* | 3/2015 | Park .................. H05K 3/32 29/832 |
| 2015/0326056 A1 | 11/2015 | Koyanagi et al. |
| 2017/0207516 A1 | 7/2017 | Koo et al. |
| 2017/0229899 A1* | 8/2017 | Noh .................. H02J 50/70 |
| 2018/0310423 A1* | 10/2018 | Koo .................. H05K 5/04 |
| 2019/0386380 A1* | 12/2019 | Ham .................. H01Q 1/243 |
| 2020/0052428 A1* | 2/2020 | Cho .................. H01R 12/73 |
| 2020/0212614 A1* | 7/2020 | Lim .................. H01R 13/6485 |
| 2020/0301371 A1 | 9/2020 | Kitamura et al. |
| 2020/0323489 A1 | 10/2020 | Kim et al. |
| 2020/0388911 A1* | 12/2020 | Kim .................. H05K 3/4644 |
| 2022/0173498 A1 | 6/2022 | Lee et al. |
| 2022/0173506 A1 | 6/2022 | Okabe et al. |

FOREIGN PATENT DOCUMENTS

| | | |
|---|---|---|
| KR | 10-2014-0060798 A | 5/2014 |
| KR | 10-2017-0087334 A | 7/2017 |
| KR | 10-2017-0093591 A | 8/2017 |
| KR | 10-2019-0140244 A | 12/2019 |
| KR | 10-2020-0113696 A | 10/2020 |
| KR | 10-2020-0120407 A | 10/2020 |
| KR | 10-2020-0140544 A | 12/2020 |
| WO | 2018/039616 A1 | 3/2018 |

* cited by examiner

ELECTRONIC DEVICE INCLUDING ANTENNA MEMBER FOR WIRELESS CHARGING

CROSS-REFERENCE TO RELATED APPLICATION(S)

This application is a continuation application, claiming priority under § 365(c), of an International application No. PCT/KR2021/018885, filed on Dec. 13, 2021, which is based on and claims the benefit of a Korean patent application number 10-2021-0035093, filed on Mar. 18, 2021, in the Korean Intellectual Property Office, the disclosure of which is incorporated by reference herein in its entirety.

TECHNICAL FIELD

The disclosure relates to an electronic device, e.g., an electronic device including an antenna member for wireless charging.

BACKGROUND ART

As electronics, information, or communication technology grows, an electronic device comes equipped with various functions. For example, smartphones pack the functionalities of a sound player, imaging device, and scheduler, as well as the communication functionality and, on top of that, may implement more various functions by having applications installed thereon. An electronic device may not only its equipped applications or stored files but also access, wiredly or wirelessly, a server or another electronic device to receive, in real-time, various pieces of information.

With advanced performance and downsizing, it becomes common to carry and use electronic devices, and there have been provided various types of portable electronic devices. For example, a plurality of portable electronic devices, such as a smartphone, a tablet personal computer (PC), a smart watch, a wireless earphone, and/or smart glasses, may be carried and used by one user. Such various types of electronic devices include a rechargeable battery and may operate within a range in which the battery capacity permits without temporal or spatial limitations even without being fed external power and, as necessary, recharge the battery by connecting an external power source.

The battery of the electronic device may be fed charging power through a wired or wireless scheme. The wired charging scheme is able to stably supply power. However, for charging multiple portable electronic devices owned by one user, the wired charging scheme requires bothering connection to each electronic device and takes a significant time to charge due to the need for sequentially charging the electronic devices. The wireless charging scheme has lower power efficiency than the wired charging scheme. However, it eliminates the need for cable connection to the electronic device and allows for simultaneous charging of multiple (e.g., two or more) electronic devices, saving charging time. The power efficiency of the wireless charging scheme is expected to be enhanced to reach that of the wired charging scheme in the future.

The above-information is presented as background information only to assist with an understanding of the disclosure. No determination has been made, and no assertion is made, as to whether any of the above might be applicable as prior art with regard to the disclosure.

DETAILED DESCRIPTION OF THE INVENTION

Technical Problem

As examples of wireless charging of an electronic device, a magnetic resonance scheme and a magnetic induction scheme may be used. The magnetic resonance scheme has a power transmission/reception range of about 1 m, which is expected to extend in the future but may require an antenna design matching the power transmission/reception frequency and may harm the human body. As compared to the magnetic resonance scheme, the magnetic induction scheme requires that the antennas (the primary coil and the secondary coil) for power transmission/reception be aligned at a fairly close distance (e.g., within a few cm) but has a greater degree of freedom in design than the magnetic resonance scheme and is known to have a low effect on the human body. For this reason, in the market of wireless charging devices for general users, device adopting the magnetic induction scheme were first commercialized and occupy a higher market share.

However, the equipment of the wireless charging function renders it difficult to miniaturize the electronic device. For example, unlike in the wired charging scheme, a wireless charging circuit for converting the induced current into operating power or charging power, such as a wireless charging antenna, a rectifier, or an analog/digital converter, may be additionally disposed in the electronic device. Given the size or weight, it may be harder to further equip the electronic device with a wireless charging function-related electronic component when the electronic device is a wearable electronic device, e.g., a smart watch, a wireless earphone, and/or smart glasses.

Aspects of the disclosure are to address at least the above-mentioned problems and/or disadvantages and to provide at least the advantages described below. Accordingly, an aspect of the disclosure is to provide an electronic device which may be easy to downsize while having a wireless charging function.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a first circuit board, an antenna member disposed to face one surface of the first circuit board, an electronic module disposed between the first circuit board and the antenna member and including a plurality of contact protrusions disposed to face the antenna member, and a plurality of contact members disposed on the antenna member and configured to electrically contact one of the plurality of contact protrusions. As the antenna member generates an induced current in reaction to an external electrical signal or an external electromagnetic field, the electronic module may be configured to supply power using the induced current generated by the antenna member.

In accordance with another aspect of the disclosure, an electronic device is provided. The electronic device includes a housing, at least one wearing member extending from the housing and configured to enable the housing to be worn on a user's body, a battery received in the housing, a first circuit board disposed between any one surface of the housing and the battery, an antenna member disposed to face one surface of the first circuit board, an electronic module disposed between the first circuit board and the antenna member and including a plurality of contact protrusions disposed to face the antenna member, and a plurality of contact members disposed on the antenna member and configured to electrically contact one of the plurality of contact protrusions. As the antenna member generates an induced current in reaction to an external electrical signal or an external electromagnetic field, the electronic module may be configured to supply power or charge the battery using the induced current generated by the antenna member.

Advantageous Effects

According to various embodiments of the disclosure, it is possible to enhance the design degree of freedom on the circuit board of the electronic device by disposing a contact member, e.g., a c-clip, on the antenna member in connecting an electronic module including an electronic component (e.g., an integrated circuit chip) equipped with a wireless charging circuit, to the antenna member. For example, since the area where the contact member is disposed is not reflected as a design element, placement of another electronic component on the circuit board or circuit wiring may be free. In another embodiment of the disclosure, it is possible to downsize the main circuit board and/or the electronic device by excluding the area where the contact member is disposed on the main circuit board of the electronic device. In another embodiment of the disclosure, as the electronic device is downsized, wearability may be enhanced while the user's fatigue may be mitigated. Other various effects may be provided directly or indirectly in the disclosure.

Other aspects, advantages, and salient features of the disclosure will become apparent to those skilled in the art from the following detailed description, which, taken in conjunction with the annexed drawings, discloses various embodiments of the disclosure.

DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer like parts, components, and structures.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skilled in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and equivalents.

It is to be understood that the singular forms "a," "an," and "the" include plural referents unless the context clearly indicates otherwise. Thus, for example, reference to "a component surface" includes reference to one or more of such surfaces.

Figure 1:
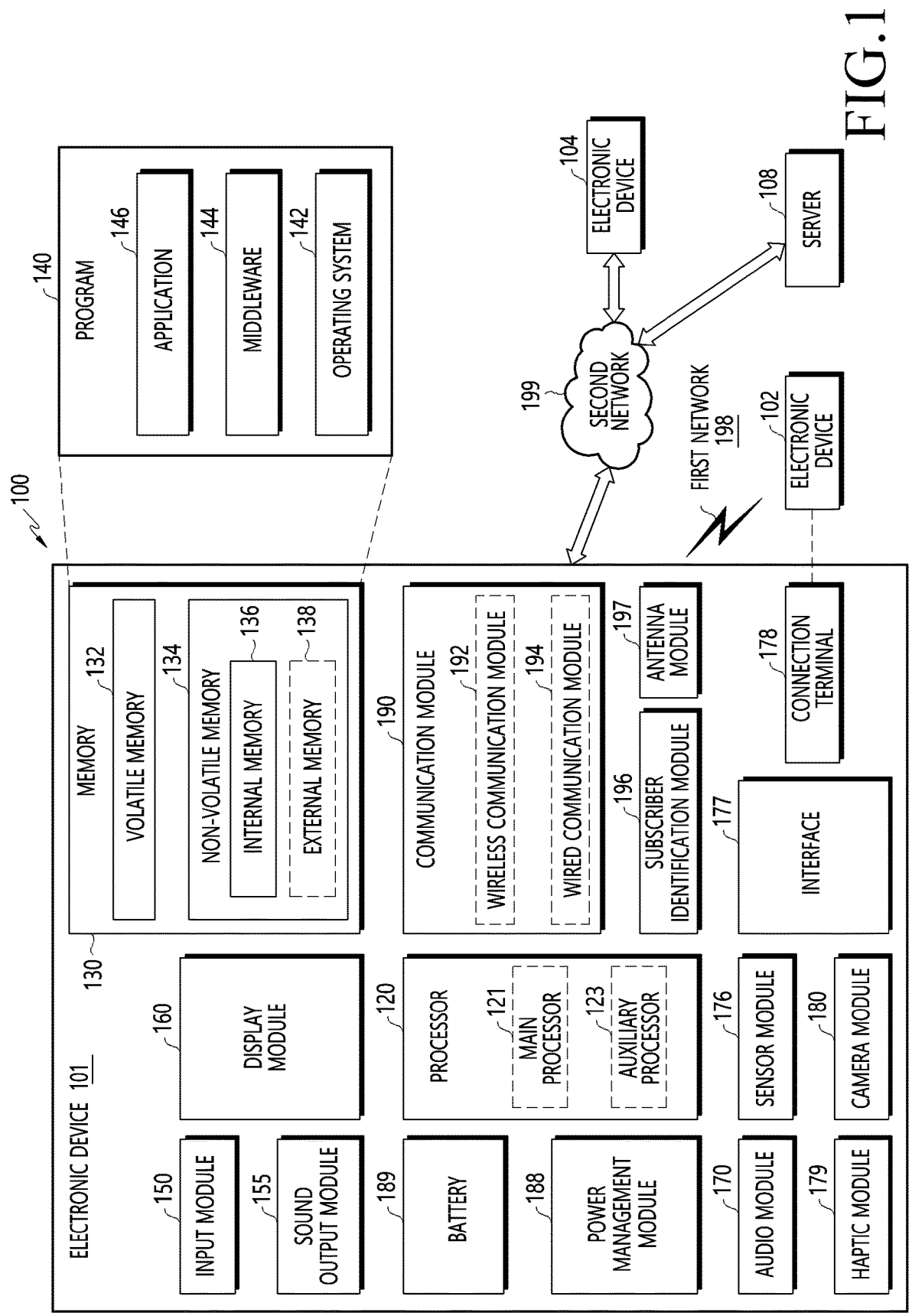
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with at least one of an electronic device 102 via a first network 198 (e.g., a short-range wireless communication network), or an electronic device 104 or a server 108 via a second network 199 (e.g., a long-range wireless communication network). According to an embodiment of the disclosure, the electronic device 101 may communicate with the electronic device 104 via the server 108. According to an embodiment of the disclosure, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments of the disclosure, at least one (e.g., the connecting terminal 178) of the components may be omitted from the electronic device 101, or one or more other components may be added in the electronic device 101. According to an embodiment of the disclosure, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123. According to an embodiment of the disclosure, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment of the disclosure, the display 160 may include a touch sensor configured to detect a touch, or a pressure sensor configured to measure the intensity of a force generated by the touch.

The audio module 170 may convert a sound into an electrical signal and vice versa. According to an embodiment of the disclosure, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment of the disclosure, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5th generation (5G) network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment of the disclosure, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment of the disclosure, the antenna module may include an antenna including a radiator formed of a conductor or conductive pattern formed on a substrate (e.g., a printed circuit board (PCB)). According to an embodiment of the disclosure, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment of the disclosure, other parts (e.g., radio frequency integrated circuit (RFIC)) than the radiator may be further formed as part of the antenna module 197.

According to various embodiments of the disclosure, the antenna module 197 may form a mmWave antenna module. According to an embodiment of the disclosure, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment of the disclosure, the external electronic device 104 may include an internet-of-things (IoT) device. The server 108 may be an intelligent server using machine learning and/or a neural network. According to an embodiment of the disclosure, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device according to various embodiments of the disclosure may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program) including one or more instructions that are stored in a storage medium (e.g., an internal memory 136 or an external memory 138) that is readable by a machine (e.g., the electronic device). For example, a processor (e.g., the processor) of the machine (e.g., the electronic device) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities. Some of the plurality of entities may be separately disposed in different components. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

Figure 2:
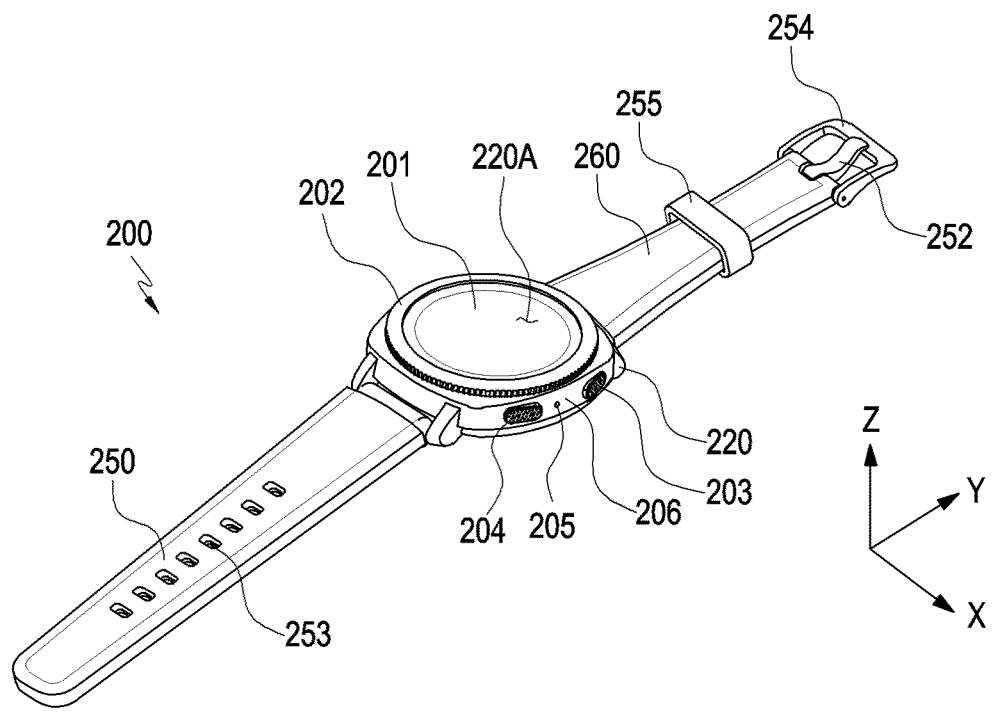
FIG. 2 is a front perspective view illustrating an electronic device according to an embodiment of the disclosure.

FIG. 2 is a front perspective view illustrating an electronic device according to an embodiment of the disclosure.

Figure 3:
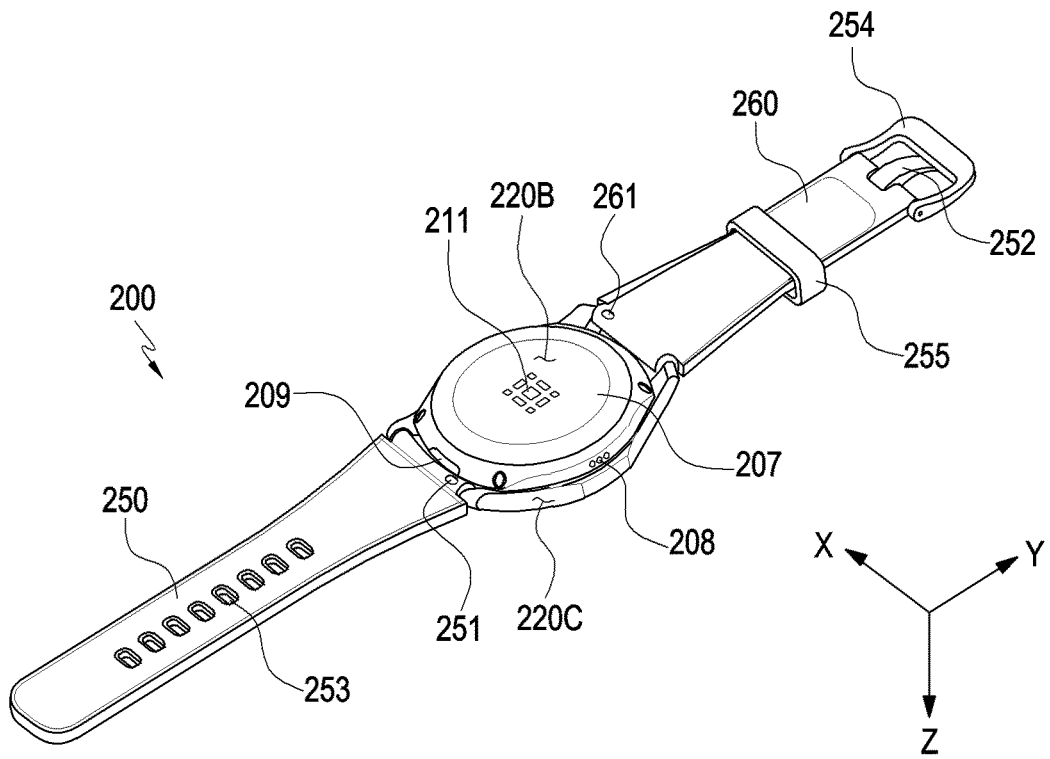
FIG. 3 is a rear perspective view illustrating an electronic device of FIG. 2 according to an embodiment of the disclosure.

FIG. 3 is a rear perspective view illustrating an electronic device of FIG. 2 according to an embodiment of the disclosure.

Referring to FIGS. 2 and 3, in the following detailed description, in FIGS. 2 to 4, the 'width direction or length direction of an electronic device 200 or the housing 220' may be any one of the X-axis direction and the Y-axis direction of the illustrated orthogonal coordinate system. When it is necessary to distinguish the width direction or the length direction, the direction of the orthogonal coordinate system illustrated in the drawings may be labeled together. In the orthogonal coordinate system of FIGS. 2 to 4, the 'Z-axis direction' may mean a thickness direction of the electronic device 200 or the housing 220. In an embodiment of the disclosure, the direction in which the front surface (e.g., the first surface 220A of FIG. 2) of the electronic device 200 or the housing 220 faces may be defined as a 'first direction' or a '+Z direction', and the direction in which the rear surface (e.g., the second surface 220B of FIG. 3) of the electronic device 200 or the housing 220 faces may be defined as a 'second direction' or a '−Z direction'.

Referring to FIGS. 2 and 3, the electronic device 200 according to an embodiment may include a housing 220 including a first surface (or a front surface) 220A, a second surface (or a rear surface) 220B, and a side surface 220C surrounding a space between the first surface 220A and the second surface 220B and wearing members 250 and 260 connected to at least a portion of the housing 220 and configured to allow the electronic device 200 or the housing 220 to be worn on the user's body part (e.g., a wrist or ankle). According to another embodiment (not shown), the housing may denote a structure forming part of the first surface 220A, the second surface 220B, and the side surfaces 220C of FIG. 2. According to an embodiment of the disclosure, at least a portion of the first surface 220A may have a substantially transparent front plate 201 (e.g., a glass plate or polymer plate including various coat layers). The second surface 220B may be formed by a rear plate 207 that is substantially opaque. According to an embodiment of the disclosure, when the electronic device may include a sensor module 211 disposed on the second surface 220B, the rear plate 207 may at least partially include a transparent area. The rear plate 207 may be formed of, e.g., laminated or colored glass, ceramic, polymer, metal (e.g., aluminum, stainless steel (STS), or magnesium), or a combination of at least two thereof. The side surface 220C may be formed by a side bezel structure (or a "side member") 206 that couples to the front plate 201 and the rear plate 207 and includes a metal and/or polymer. According to an embodiment of the disclosure, the rear plate 207 and the side bezel plate 206 may be integrally formed together and include the same material (e.g., a metal, such as aluminum). The wearing members 250 and 260 may be formed of various materials in various shapes. A uni-body structure or multiple unit links which is flexible may be formed of fabric, leather, rubber, urethane, metal, ceramic, or a combination of at least two thereof.

According to an embodiment of the disclosure, the electronic device 200 may include at least one or more of a display 320 (refer to FIG. 4), audio modules 205 and 208, a sensor module 211, key input devices 202, 203, and 204, and a connector hole 209. According to an embodiment of the disclosure, the electronic device 200 may exclude at least one (e.g., the key input devices 202, 203, and 204, connector hole 209, or sensor module 211) of the components or may add other components.

The display (e.g., the display 320 of FIG. 4) may be exposed through a significant portion of the front plate 201. The display 320 may have a shape corresponding to the shape of the front plate 201, e.g., a circle, ellipse, or polygon. The display 320 may be coupled with, or disposed adjacent, a touch detection circuit, a pressure sensor capable of measuring the strength (pressure) of touches, and/or fingerprint sensor.

The audio modules 205 and 208 may include a microphone hole 205 and a speaker hole 208. The microphone hole 205 may have a microphone inside to obtain external sounds. According to an embodiment of the disclosure, there may be a plurality of microphones to be able to detect the direction of a sound. The speaker hole 208 may be used for an external speaker or a receiver for phone talks. According to an embodiment of the disclosure, a speaker may be included without the speaker hole (e.g., a piezo speaker).

The sensor module 211 may produce an electrical signal or data value corresponding to the internal operation state or external environment state of the electronic device 200. The sensor module 311 may include, e.g., a biometric sensor module 311 (e.g., a heartrate monitor (HRM) sensor) disposed on the second surface 220B of the housing 220. The electronic device 200 may further include sensor modules not shown, e.g., at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

The key input devices 202, 203, and 204 may include a wheel key 202 disposed on the first surface 220A of the housing 220 to be rotatable in at least one direction and/or key buttons 203 and 204 disposed on the side surface 220C of the housing 220. The wheel key 202 may have a shape corresponding to the shape of the front plate 201. According to another embodiment of the disclosure, the electronic device 200 may exclude all or some of the above-mentioned key input devices 202, 203, and 204, and the excluded key input devices 202, 203, and 204 may be implemented in other forms, e.g., as soft keys on the display 320. The connector hole 209 may receive a connector (e.g., a universal serial bus (USB) connector) for transmitting and receiving power and/or data to/from an external electronic device. Another connector hole (not shown) may be included for receiving a connector for transmitting and receiving audio signals to/from the external electronic device. The electronic device 200 may further include a connector cover (not shown) to cover at least a portion of, e.g., the connector hole 209 and preventing undesirable materials from entering the connector hole.

The wearing members 250 and 260 may detachably be fastened to at least portions of the housing 220 via locking members 251 and 261. The locking members 251 and 261 may include components or parts for coupling, such as pogo pins, and, according to an embodiment of the disclosure, may be replaced with protrusions or recesses formed on/in the wearing members 250 and 260. For example, the wearing members 250 and 260 may be coupled in such a manner as to be fitted into or over the recesses or protrusions formed on the housing 220. The wearing members 250 and 260 may include one or more of a fastening member 252, fastening member coupling holes 253, a band guide member 254, and a band fastening ring 255.

The fastening member 252 may be configured to allow the housing 220 and the wearing members 250 and 260 to be fastened to the user's body portion (e.g., wrist or ankle). The fastening member coupling holes 253 may fasten the housing 220 and the wearing members 250 and 260 to the user's body portion, corresponding to the fastening member 252. The band guide member 254 may be configured to restrict movement of the fastening member 252 to a certain range when the fastening member 252 fits into one of the fastening member coupling holes 253, thereby allowing the wearing members 250 and 260 to be tightly fastened onto the user's body portion. The band fastening ring 255 may limit the range of movement of the wearing members 250 and 260, with the fastening member 252 fitted into one of the fastening member coupling holes 253.

Figure 4:
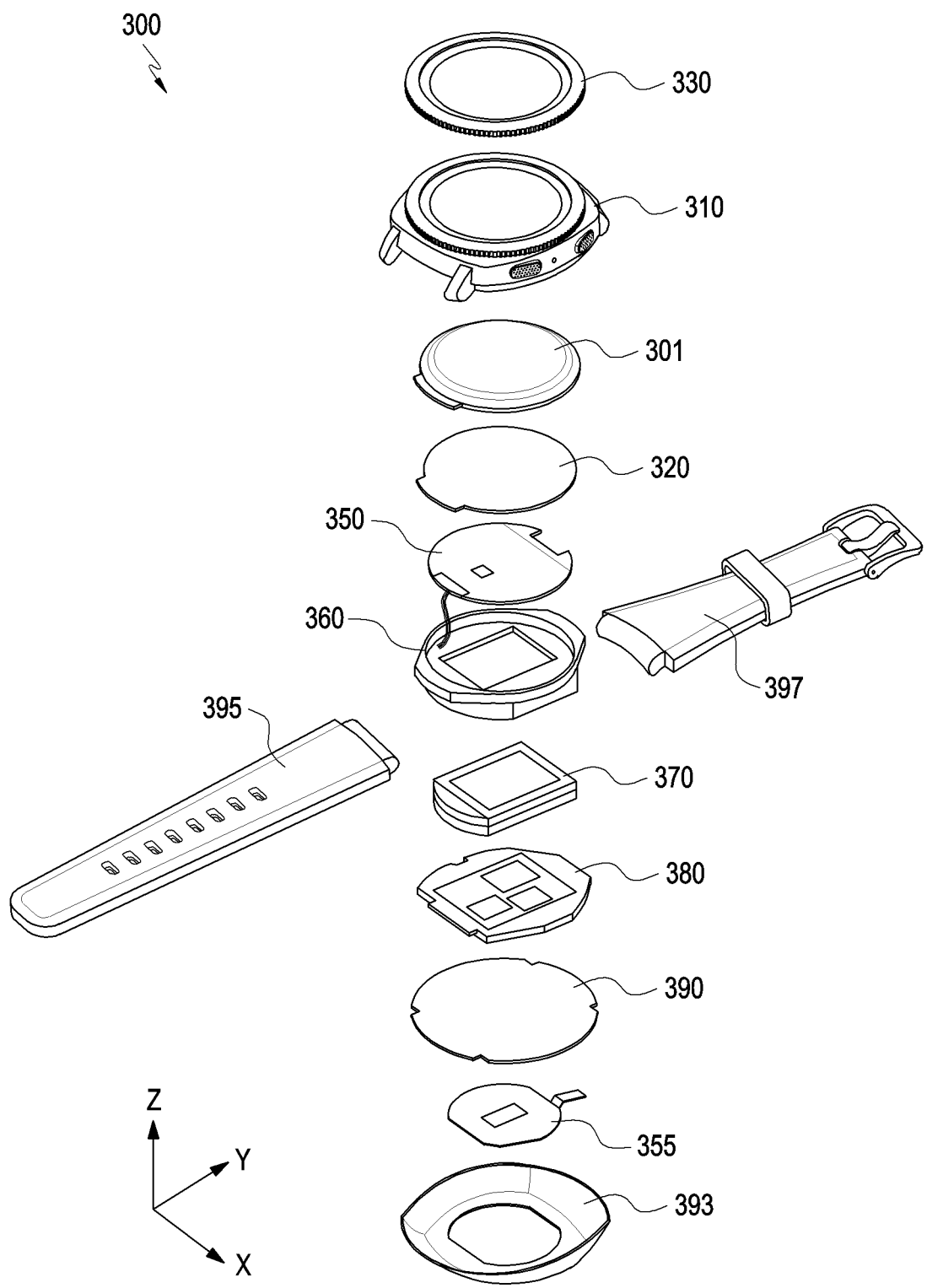
FIG. 4 is an exploded perspective view illustrating an electronic device of FIG. 2 according to an embodiment of the disclosure.

FIG. 4 is an exploded perspective view illustrating an electronic device of FIG. 2 according to an embodiment of the disclosure.

Referring to FIG. 4, an electronic device 300 may include a side bezel structure 310, a wheel key 330, a front plate 301 (e.g., the front plate 201 of FIG. 2), a display 320, a first antenna 350, a second antenna (e.g., the antenna included in the auxiliary circuit board 355), a supporting member 360 (e.g., a bracket), a battery 370, a printed circuit board 380, a sealing member 390, a rear plate 393, and wearing members 395 and 397. At least one of the components of the electronic device 300 may be the same or similar to at least one of the components of the electronic device 200 of FIG. 2 or 3 and no duplicate description is made below. The supporting member 360 may be disposed inside the electronic device 300 to be connected with the side bezel structure 310 or integrated with the side bezel structure 310. The supporting member 360 may be formed of, e.g., a metal and/or non-metallic material (e.g., polymer). The display 320 may be joined onto one surface of the supporting member 360, and the printed circuit board 380 may be joined onto the opposite surface of the supporting member 274. A processor, memory, and/or interface may be mounted on the printed circuit board 380. The processor may include one or more of, e.g., a central processing unit, an application processor, a graphic processing unit (GPU), a sensor processor, or a communication processor.

The memory may include, e.g., a volatile or non-volatile memory. The interface may include, e.g., a high definition multimedia interface (HDMI), a universal serial bus (USB) interface, a secure digital (SD) card interface, and/or an audio interface. The interface may electrically or physically connect, e.g., the electronic device 300 with an external electronic device and may include a USB connector, an SD card/multimedia card (MMC) connector, or an audio connector.

The battery 370 may be a device for supplying power to at least one component of the electronic device 300. The battery 277 may include, e.g., a primary cell which is not rechargeable, a secondary cell which is rechargeable, or a fuel cell. At least a portion of the battery 370 may be disposed on substantially the same plane as the printed circuit board 380. The battery 370 may be integrally or detachably disposed inside the electronic device 300.

The first antenna 350 may be disposed between the display 320 and the supporting member 360. The first antenna 350 may include, e.g., a near-field communication (NFC) antenna, a wireless charging antenna, and/or a magnetic secure transmission (MST) antenna. The first antenna 350 may perform short-range communication with an external device, wirelessly transmit/receive power necessary for charging, or transmit magnetic-based signals including payment data or short-range communication signals. According to an embodiment of the disclosure, an antenna structure may be formed by a portion or combination of the side bezel structure 310 and/or the supporting member 360.

The auxiliary circuit board 355 may be disposed between the circuit board 380 and the rear plate 393. The auxiliary circuit board 355 may include a second antenna, e.g., an NFC antenna, a wireless charging antenna, and/or an MST antenna. The auxiliary circuit board 355 may perform short-range communication with an external device, wirelessly transmit/receive power necessary for charging, or transmit magnetic-based signals including payment data or short-range communication signals, using the second antenna. According to another embodiment of the disclosure, an antenna structure may be formed of a portion or combination of the side bezel structure 310 and/or the rear plate 393. According to various embodiments of the disclosure, when the electronic device 300 (e.g., the electronic device 200 of FIGS. 2 and 3) includes a sensor module (e.g., the sensor module 211 of FIG. 2), the sensor circuit disposed on the auxiliary circuit board 355 or a sensor element (e.g., a photoelectric conversion element or an electrode pad) separate from the auxiliary circuit board 355 may be disposed. For example, an electronic component provided as the sensor module 211 may be disposed between the circuit board 380 and the rear plate 393.

The sealing member 390 may be positioned between the side bezel structure 310 and the rear plate 393. The sealing member 390 may be configured to block moisture or foreign bodies that may enter the space surrounded by the side bezel structure 310 and the rear plate 393, from the outside.

According to various embodiments of the disclosure, the electronic device 200 or 300 may include a wireless charging circuit-equipped electronic module (e.g., the electronic module 400a or 400b of FIGS. 5 to 7 or FIG. 9) to thereby wirelessly receive power using at least one of the first antenna 350 or the second antenna (e.g., the antenna mounted on the auxiliary circuit board 355). For example, at least one of the first antenna 350 or the second antenna may generate an induced current in reaction to an electric signal, such as a magnetic resonance signal, or an electromagnetic field formed around. The electronic module 400a or 400b may supply power to the electronic device 200 or 300 or provide power for charging the battery 370 using the induced current. The wireless charging circuit-equipped electronic module 400a or 400b is described further with reference to FIGS. 5 to 7.

Figure 5:
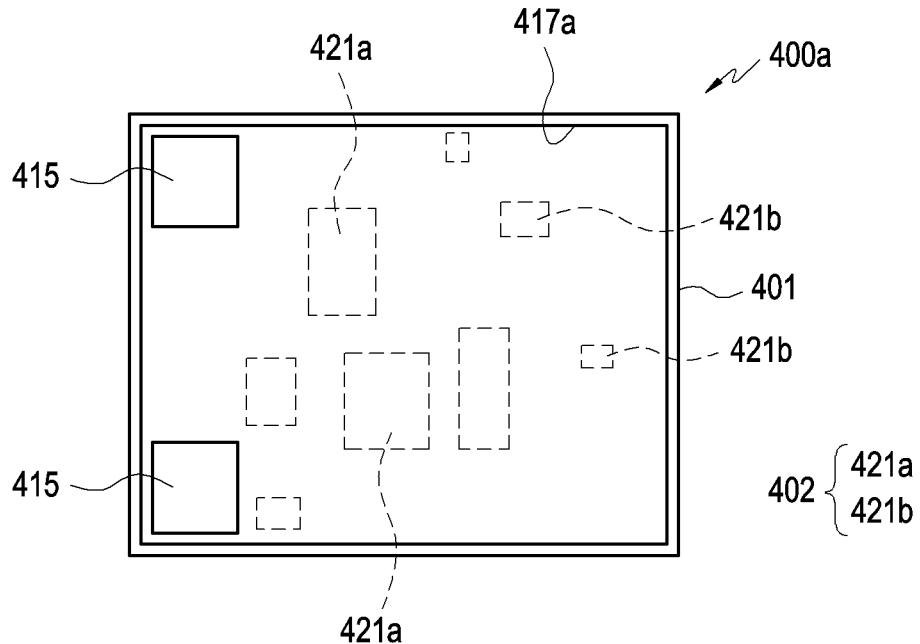
FIG. 5 is a plan view illustrating an electronic module of an electronic device according to an embodiment of the disclosure.

FIG. 5 is a plan view illustrating an electronic module of an electronic device (e.g., the electronic device 101, 102, 104, 200, or 300 of FIGS. 1 to 4) according to an embodiment of the disclosure.

Figure 6:
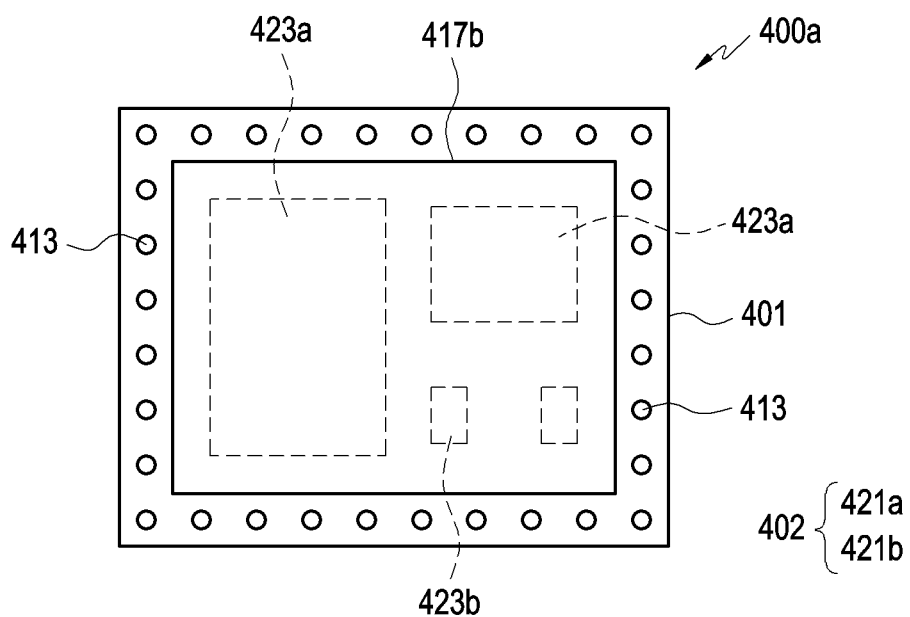
FIG. 6 is a bottom view illustrating an electronic module of FIG. 5 according to an embodiment of the disclosure.

FIG. 6 is a bottom view illustrating an electronic module of FIG. 5 according to an embodiment of the disclosure.

Figure 7:
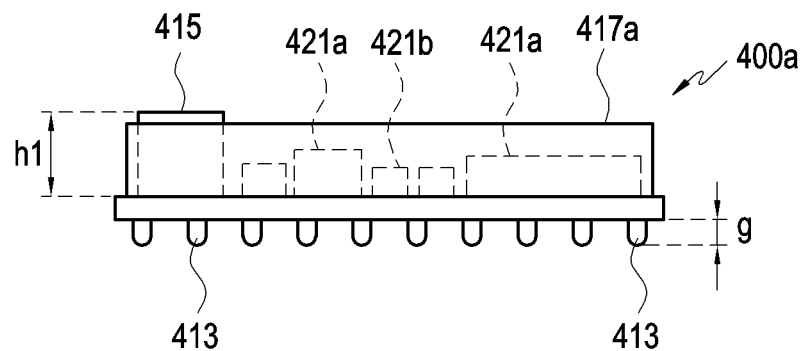
FIG. 7 is a side view illustrating an electronic module of FIG. 5 according to an embodiment of the disclosure.

FIG. 7 is a side view illustrating an electronic module of FIG. 5 according to an embodiment of the disclosure.

Referring to FIGS. 5, 6, and 7, the electronic module 400a may include a baseboard 401, solder balls 413, and/or at least one electronic component 402. The baseboard 401 may be coupled to another printed circuit board (e.g., the printed circuit board 380 of FIG. 4) through the solder balls 413 and may be electrically connected with the other printed circuit board 380 through the solder balls 413. The baseboard 401 may include a plurality of contact protrusions 415 protruding from one surface thereof and may be electrically connected through the contact protrusions 415 to an antenna member (e.g., the antenna module 197 of FIG. 1, the second antenna (e.g., the antenna mounted on the auxiliary circuit board 355) of FIG. 4, and/or the antenna member 455 of FIG. 8). For example, the contact protrusions 415 are formed of an electrically conductive material (e.g., a paste based on copper (Cu), tin (Sn), silver (Ag), and/or a mixture thereof)

and may be formed in a circular, oval, and/or polygonal column shape. In an embodiment of the disclosure, the antenna member 455 may generate an induced current by receiving an external electrical signal or in reaction to an external electromagnetic field. The electronic module 400a may supply the operating power of the electronic device (e.g., the electronic device 101, 102, 104, 200, or 300 of FIGS. 1 to 4) and/or power for charging the battery (e.g., the battery 370 of FIG. 4) using the induced current.

According to various embodiments of the disclosure, the electronic module 400a may include at least one first integrated circuit chip 421a, at least one first passive element 421b, at least one second integrated circuit chip 423a, and/or at least one second passive element 423b disposed on one surface of the baseboard 401 or the other surface thereof. For example, the integrated circuit chips 421a and 423a and/or the passive elements 421b and 423b may be provided as the electronic component 402. In an embodiment of the disclosure, the plurality of solder balls 413 may be provided on the other surface of the baseboard 401 and may be at least partially arranged around the area in which the second integrated circuit chip 423a and/or the second passive element 423b are disposed.

According to various embodiments of the disclosure, at least one of the first integrated circuit chip 421a or the second integrated circuit chip 421b may include a wireless charging circuit (e.g., the power management module 188 of FIG. 1), thereby supplying power for operating or charging the electronic device 200 or 300 using the induced current generated by the second antenna (e.g., the antenna mounted on the auxiliary circuit board 355) of FIG. 4 or the antenna member 455 described below. According to an embodiment of the disclosure, at least one of the first integrated circuit chip 421a or the second integrated circuit chip 423a may further include a proximity wireless communication module or a magnetic secure transmission module (e.g., the wireless communication module 192 of FIG. 1). For example, at least one of the first integrated circuit chip 421a or the second integrated circuit chip 423a may perform wireless communication using the second antenna (e.g., the antenna mounted on the auxiliary circuit board 355) of FIG. 4 or the antenna member 455 to be described below.

According to various embodiments of the disclosure, the electronic module 400a may further include insulating resin layers 417a and 417b applied to at least one surface of the baseboard 401. The insulating resin layers 417a and 417b may substantially seal the electronic component(s) 402 disposed on one surface or the other surface of the baseboard 401. For example, electronic components (e.g., the first integrated circuit chip 421a and the first passive element 421b) may be substantially buried in the first insulating resin layer 417a on the one surface of the baseboard 401, and electronic components (e.g., the second integrated circuit chip 423a or the second passive element 423b) may be buried in the second insulating resin layer 417b on the other surface of the base surface 401. Although not shown, an electromagnetic shielding material may be added to the insulating resin layers 417a and 417b, or an electromagnetic shielding material may be applied or attached to the surface of the insulating resin layers 417a and 417b to provide an electromagnetic shielding structure.

According to various embodiments of the disclosure, the solder balls 413 or contact protrusions 415 that are disposed on the baseboard 401 and contact or couple with other external components may not be at least partially buried in the insulating resin layers 417a and 417b. For example, the solder balls 413 may be substantially disposed outside the second insulating resin layer 417b. However, it should be noted that various embodiments of the disclosure are not limited thereto, and the baseboard 401 or the electronic module 400a is coupled to another printed circuit board (e.g., the printed circuit board 380 or 480 of FIG. 4 or FIG. 8) and then the space between the baseboard 401 and the other printed circuit board is filled with another insulating resin layer in which the solder balls 413 may then be buried. In another embodiment of the disclosure, some of the contact protrusions 415 may be buried in the first insulating resin layer 417a, and the rest of the contact protrusions 415 may be exposed to the outside of the first insulating resin layer 417a.

According to various embodiments of the disclosure, the first height h1 of the contact projection(s) 415 extends from the baseboard 401 may be large as compared to the contact area between the contact projection(s) 415 and the baseboard 401. As the contact area decreases, it may be sufficiently expected that the downsizing of the baseboard 401 may be facilitated. However, if the contact area is reduced, the fixing strength between the contact protrusions 415 and the baseboard 401 may be reduced, and the contact protrusions 415 may be separated from the baseboard 401 due to contact with an external object. The insulating resin layer (e.g., the first insulating resin layer 417a) may be applied or formed on one surface of the baseboard 401 in a state of surrounding most of the contact protrusions 415, stably fastening the contact protrusions 415 to the baseboard 401.

Figure 8:
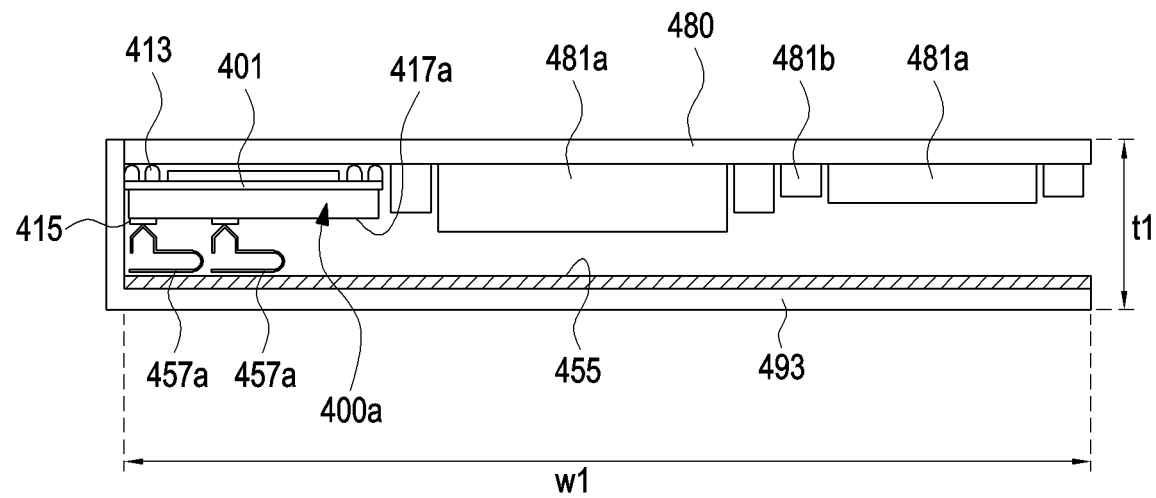
FIG. 8 is a side view illustrating a configuration in which an electronic module of FIG. 5 is connected with an antenna member according to an embodiment of the disclosure.

According to various embodiments of the disclosure, the first height h1 of the contact protrusions 415 extending or protruding from one surface of the baseboard 401 may be larger than the height g of the solder balls 413 (e.g., the distance between the printed circuit board 480 and the baseboard 401 in FIG. 8). In the illustrated embodiment of the disclosure, the solder balls 413 have a circular or protrusion shape, but in a state of coupling the circuit boards (e.g., the printed circuit board 480 and the baseboard 401 in FIG. 8) to face each other, the solder balls 413 may be deformed into a substantially disk shape. In some embodiments of the disclosure, the extending or protruding first height h1 of the contact protrusions 415 may be larger than the height of the first integrated circuit chip 421a or the first passive element 421b. For example, even when the first integrated circuit chip 421a or the first passive element 421b is substantially buried in the first insulating resin layer 417a, portions of the contact protrusions 415 may be exposed to the outside of the first insulating resin layer 417a.

The above-described electronic module 400a may be disposed between the other circuit board (e.g., the printed circuit board 380 of FIG. 4 or the first circuit board 480 of FIG. 8) and the antenna member (e.g., the auxiliary circuit board 355 of FIG. 4 or the antenna member 455 of FIG. 8), supplying power to the electronic device 200 or 300 or the other circuit board or charge the battery (e.g., the battery 189 or 370 of FIG. 1 or 4) using the induced current generated from the antenna member 455. In some embodiments of the disclosure, the above-described electronic module 400a may function as the power management module 188 or the communication module 190 of FIG. 1. The structure in which the above-described electronic module 400a is disposed in the electronic device (e.g., the electronic device 101, 102, 104, 200, or 300 of FIGS. 1 to 4) is described with further reference to FIG. 8.

FIG. 8 is a side view illustrating a configuration in which an electronic module of FIG. 5 is connected with an antenna member 455 according to an embodiment of the disclosure.

Referring to FIG. 8, an electronic device (e.g., the electronic device 101, 102, 104, 200, or 300 of FIGS. 1 to 4) may include a first circuit board 480 and an antenna member 455. The electronic module 400*a* may be disposed between the first circuit board 480 and the antenna member 455. According to an embodiment of the disclosure, the first circuit board 480 may be a main circuit board of the electronic device 200 or 300, e.g., the printed circuit board 380 of FIG. 4, and the antenna member 455 may be either the first antenna 350 of FIG. 4 or the second antenna mounted on the auxiliary circuit board antenna 355. In an embodiment of the disclosure, the electronic device 200 or 300 may further include a cover member 493 (e.g., the rear plate 393 of FIG. 3) disposed to face the first circuit board 480 with the antenna member 455 interposed therebetween. The antenna member 455 may be disposed on the inner surface of the cover member 493.

According to various embodiments of the disclosure, the first circuit board 480 may include other electronic components (e.g., a plurality of integrated circuit chips 481*a* or passive elements 481*b*). Various circuit devices, such as the processor 120, the memory 130, and/or the communication module 190 of FIG. 1 may be disposed on the first circuit board 480 in the form of such other electronic components. In an embodiment of the disclosure, the electronic module 400*a* may be disposed on any one surface of the first circuit board 480. For example, the electronic module 400*a* may be coupled to the first circuit board 480 through the solder balls 413, and the solder balls 413 may form electrical connection between the first circuit board 480 and the second circuit board (e.g., the baseboard 401). In some embodiments of the disclosure, the first circuit board 480 may provide at least a portion of an electrical wiring connecting the electronic module 400*a* and the battery (e.g., the battery 370 of FIG. 4).

According to various embodiments of the disclosure, the electronic device 200 or 300 may provide an electrical connection between the antenna member 455 and the electronic module 400*a* by including a plurality of contact members 457*a* (e.g., elastic members, such as c-clips). The contact members 457*a* may be at least partially disposed on, e.g., the antenna member 455 and, if the antenna member 455 is disposed in the electronic device 200 or 300, it may contact any one of the contact protrusions 415. In an embodiment of the disclosure, the antenna member 455 may be disposed to face one surface of the first circuit board 480 (e.g., the printed circuit board 380 of FIG. 4) inside the electronic device 200 or 300. The contact protrusions 415 may be exposed to the outside of the first insulating resin 417*a* in the direction (e.g., the Z-axis direction of FIG. 4 or the direction of the first thickness t1 of FIG. 8) in which the antenna member 455 and the first circuit board 480 face each other. For example, the contact members 457*a* may contact any one of the contact protrusions 415 in the direction in which the antenna member 455 and the first circuit board 480 face each other.

According to various embodiments of the disclosure, in the electrical connection structure between the electronic module 400*a* and the antenna member 455, the above-described arrangement structure of the contact protrusion(s) 415 and the contact member 457*a* may contribute to downsizing of the electronic device 200 or 300 or the first circuit board 480. For example, if the contact member 457*a* is disposed on the baseboard 401 or the first circuit board 480, the size (e.g., the first width w1) of the baseboard 401 or the first circuit board 480 may be increased, or the area in which the electronic components 402 of FIGS. 5 to 7 may be disposed may be narrowed. In general, no other electronic component(s) are disposed in the antenna member 455. In various embodiments of the disclosure, as the contact member 457*a* is disposed on the antenna member 455, it is possible to further secure an area in which the electronic components may be disposed on the baseboard 401 or the first circuit board 480 or to downsize the baseboard 401 or the first circuit board 480.

According to various embodiments of the disclosure, if the contact member 457*a* is disposed on the antenna member 455 and disposed close to the baseboard 401, it is possible to secure a space for preventing interference between the contact member 457*a* and the electronic components 402 (e.g., the first integrated circuit chip 421*a* and/or the first passive element 421*b*) of FIG. 5 or 7. The space for preventing interference may substantially impede the design degree of freedom in arranging the electronic components 402 or cause an obstacle to downsizing of the baseboard 401. In various embodiments of the disclosure, the contact protrusions 415 may substantially protrude or extend higher than the electronic components 402 of FIG. 5 or 7 and contact any one of the contact members 457*a*, preventing interference between the electronic components 402 and the contact members 457*a* while forming an electrical connection between the electronic module 400*a* and the antenna member 455.

In some embodiments of the disclosure, the electronic components 402 of FIGS. 5 to 7 and/or the contact members 457*a* of FIG. 8 may be disposed on the first circuit board rather than the second circuit board (e.g., the baseboard 401) (hereinafter, a 'first comparative example'). In this case, the baseboard 401 may be omitted. In this first comparative example, the electronic components 402 and/or the contact members 457*a* of FIGS. 5 to 7 may be disposed on the first circuit board 480 in an area of approximately 30.5 mm^2. In arranging the electronic components and/or contact protrusions, it is possible to dispose the electronic module 400*a* using an area of about 17 mm^2, which is about 44% reduced in the area of arrangement, on the first circuit board 480 in the embodiment exemplified in FIG. 8 by using the electronic module 400*a* of FIGS. 5 to 7 and disposing the contact members 457*a* on the antenna member 455. For example, according to various embodiments of the disclosure, the electronic device 200 or 300 and/or the first circuit board 480 may be downsized while having a wireless charging function.

According to various embodiments of the disclosure, it is possible to maintain the size (e.g., the first width w1) of the first circuit board 480 identical to that in the embodiment of FIG. 8 by disposing the electronic components of the first comparative components using both the surfaces of the first circuit board 480 (hereinafter, a 'second comparative example'). However, in the second comparative example, it could be identified that the first thickness t1 in the area or space where the first circuit board 480 (and/or electronic components) is disposed from the cover member 493 was about 2.49 mm in the embodiment exemplified in FIG. 8 but was about 2.55 mm increased in the second comparative example. For example, as compared with the embodiment exemplified in FIG. 8, in the second comparative example, the distance between the antenna member 455 and the first circuit board 480 is slightly reduced, but the first thickness t1 may be further increased due to the electronic components disposed on the upper surface of the first circuit board 480. In another embodiment of the disclosure, similar to the second comparative example, when the integrated circuit chip 481 or the passive element 481*b* in the embodiment exemplified in FIG. 8 is properly distributed on both the surfaces of the first circuit board 480, the first thickness t1 in the embodiment of FIG. 8 may be similar to that in the second comparative example, and the size (e.g., the first width w1) of the first circuit board 480 or the electronic device 200 or 300 may be further reduced.

Figure 9:
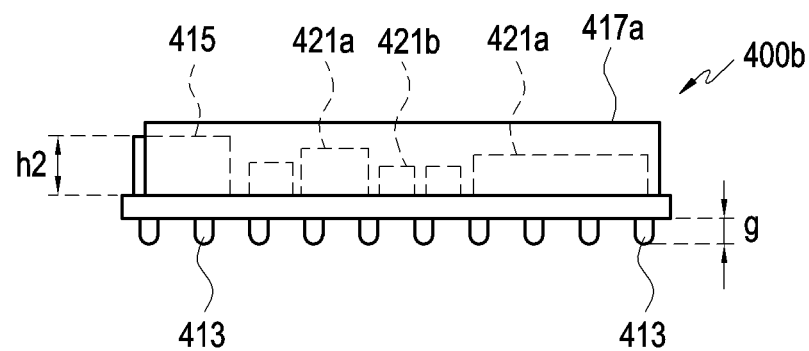
FIG. 9 is a side view illustrating an electronic module of an electronic device according to an embodiment of the disclosure.

FIG. 9 is a side view illustrating an electronic module of an electronic device (e.g., the electronic device 101, 102, 104, 200, or 300 of FIGS. 1 to 4) according to an embodiment of the disclosure.

Figure 10:
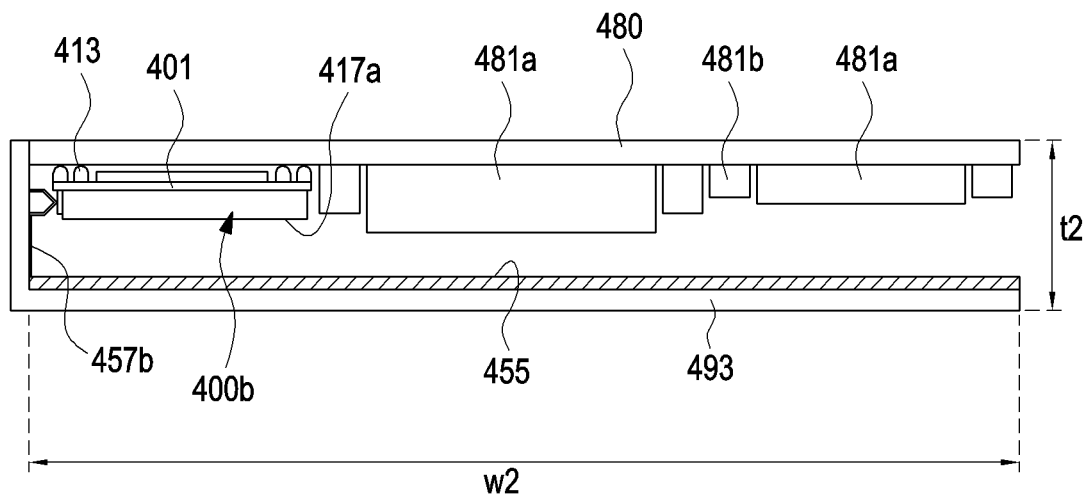
FIG. 10 is a side view illustrating a configuration in which an electronic module of FIG. 9 is connected with an antenna member according to an embodiment of the disclosure.

FIG. 10 is a side view illustrating a configuration in which an electronic module 400b of FIG. 9 is connected with an antenna member 455 according to an embodiment of the disclosure.

The embodiment of FIGS. 9 and 10 may be different from the embodiment of FIGS. 7 and 8 in a direction in which the contact protrusion 415 is exposed to the outside of the insulating resin (e.g., the first insulating resin 417a). In describing the embodiment of FIGS. 9 and 10, the components which may easily be appreciated through FIGS. 7 and 8 are denoted with or without the same reference numerals and their detailed description may be skipped.

Referring to FIGS. 9 and 10, the contact protrusion 415 may protrude or extend from the baseboard 401 at a second height h2 lower than the first insulating resin 417a in the second thickness t2 direction and may be exposed to the outside of the first insulating resin 417a in the second width w2 direction. For example, the contact member(s) 457b may contact any one of the contact protrusions 415 in a direction crossing the direction (e.g., the second thickness t2 direction) in which the first circuit board 480 and the antenna member 455 face each other. According to an embodiment of the disclosure, the contact member(s) 457b may contact any one of the contact protrusions 415 in a direction (e.g., the second width w2 direction) substantially perpendicular to the second thickness t2 direction.

According to various embodiments of the disclosure, as compared with the embodiment exemplified in FIG. 8, the second thickness t2 in the embodiment of FIGS. 9 and 10 may be smaller than the first thickness t1 by the height of the contact member 457a of FIG. 8. In another embodiment of the disclosure, as compared with the embodiment exemplified in FIG. 8, in the embodiment of FIGS. 9 and 10, the second width w2 may be larger than the first width w1 as much as the contact member 457b of FIG. 10 is disposed. In an embodiment of the disclosure, it could be identified that the electronic module 400b and the contact member 457b might occupy an area of about 21.5 mm^2 on the first circuit board 480, and the second thickness t2 of the area or space where the first circuit board 480 (and/or electronic components) was disposed from the cover member 493 was about 1.64 mm. For example, as compared with the embodiment of FIG. 8, it may be identified that the arrangement structure of FIGS. 9 and 10 requires a larger mounting area but has a significantly reduced thickness. As compared with the above-described first comparative example, in the embodiment of FIGS. 9 and 10, it may be identified that the mounting area is reduced by about 30%, and the thickness is enhanced by about 35%.

As described above, according to various embodiments of the disclosure, the electronic device (e.g., the electronic device 101, 102, 104, 200, or 300 of FIGS. 1 to 4) may be easily downsized while having a wireless charging function, by mounting electronic components, e.g., a wireless charging circuit, on the second circuit board (e.g., the baseboard 401 of FIGS. 5 to 10) separated from the main circuit board (e.g., the printed circuit board 380 of FIG. 4 or the first circuit board 480 of FIGS. 8 and 10) and using the contact protrusion 415 and of the baseboard 401 and the contact member 457a or 457b disposed on the antenna member 455 in connecting the antenna member 455 and the baseboard 401. This arrangement or connection structure may contribute to enhancing wearability or mitigating user fatigue while mounting a wireless charging function in a downsized electronic device, such as a wearable electronic device (e.g., the electronic devices 200 or 300 of FIGS. 2 to 4).

Figure 11:
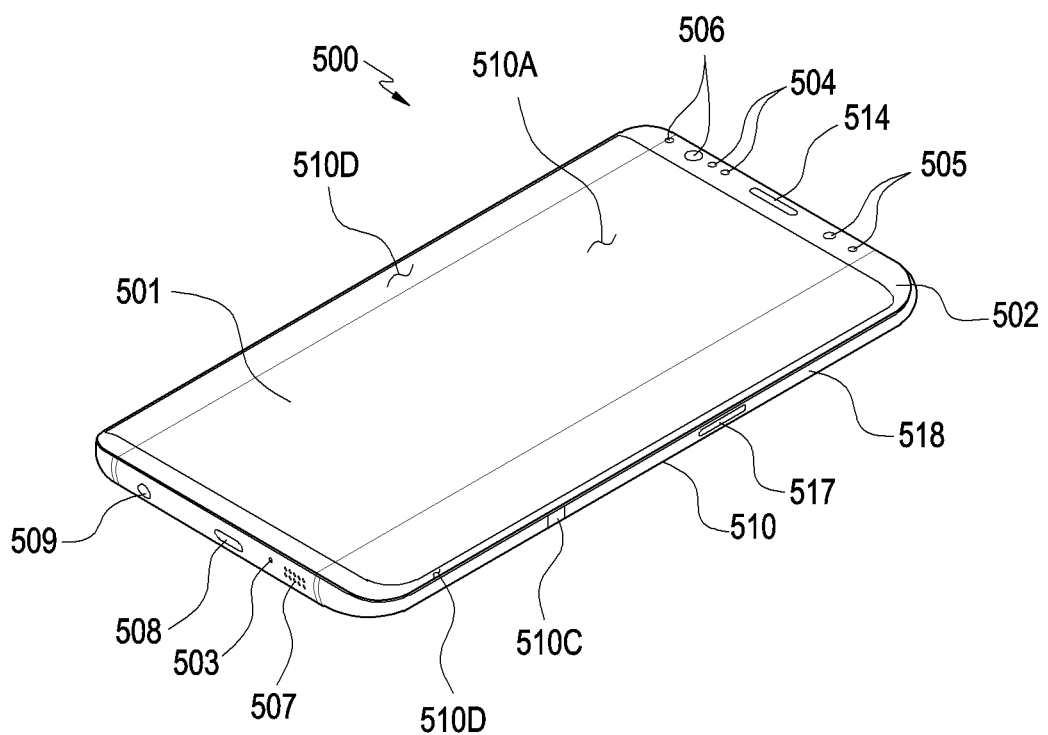
FIG. 11 is a perspective view illustrating an electronic device according to an embodiment of the disclosure.

FIG. 11 is a perspective view illustrating an electronic device (e.g., the electronic device 101, 102, 104, 200, or 300 of FIGS. 1 to 4) according to an embodiment of the disclosure.

Figure 12:
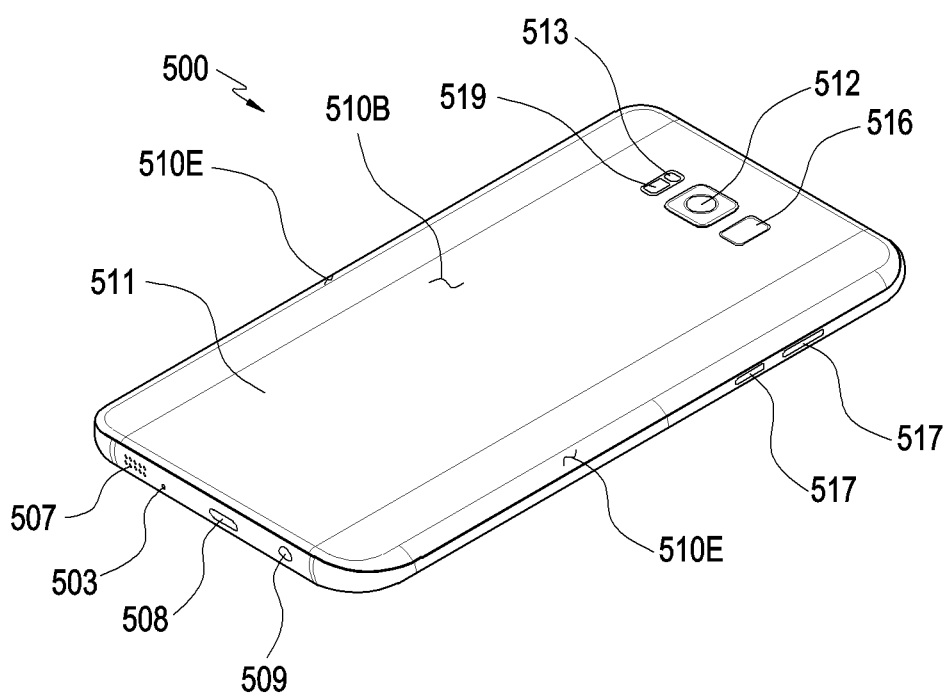
FIG. 12 is a rear perspective view illustrating an electronic device of FIG. 11 according to an embodiment of the disclosure.

FIG. 12 is a rear perspective view illustrating an electronic device as illustrated in FIG. 11 according to an embodiment of the disclosure.

Referring to FIGS. 11 and 12, an electronic device 500 according to an embodiment may include a housing 510 including a first surface (or a front surface) 510A, a second surface (or a rear surface) 510B, and a side surface 510C surrounding a space between the first surface 510A and the second surface 510B. According to another embodiment (not shown), the housing may denote a structure forming part of the first surface 510A, the second surface 510B, and the side surfaces 510C of FIG. 11. According to an embodiment of the disclosure, at least a portion of the first surface 510A may have a substantially transparent front plate 502 (e.g., a glass plate or polymer plate including various coat layers). The second surface 510B may be formed by a rear plate 511 that is substantially opaque. The rear plate 511 may be formed of, e.g., laminated or colored glass, ceramic, polymer, metal (e.g., aluminum, stainless steel (STS), or magnesium), or a combination of at least two thereof. The side surface 510C may be formed by a bezel structure (or a "side structure") 518 that couples to the front plate 502 and/or the rear plate 511 and includes a metal and/or polymer. According to an embodiment of the disclosure, the rear plate 511 and the side structure 518 may be integrally formed together and include the same material (e.g., a metal, such as aluminum).

In the embodiment illustrated, the front plate 502 may include two first areas 510D, which seamlessly and bendingly extend from the first surface 510A to the rear plate 511, on both the long edges of the front plate 502. In the embodiment (refer to FIG. 12) illustrated, the rear plate 511 may include two second areas 510E, which seamlessly and bendingly extend from the second surface 510B to the front plate 502, on both the long edges. According to an embodiment of the disclosure, the front plate 502 (or the rear plate 511) may include only one of the first areas 510D (or the second areas 510E). According to another embodiment of the disclosure, the first areas 510D or the second areas 510E may partially be excluded. According to the embodiments of the disclosure, at side view of the electronic device 500, the side structure 518 may have a first thickness (or width) for sides that do not have the first areas 510D or the second areas 510E and a second thickness, which is smaller than the first thickness, for sides that have the first areas 510D or the second areas 510E.

According to an embodiment of the disclosure, the electronic device 500 may include at least one or more of a display 501, audio modules 503, 507, and 514, sensor modules 504, 516, and 519, camera modules 505 and 512, key input devices 517, a light emitting device 506, and connector holes 508 and 509. According to an embodiment of the disclosure, the electronic device 500 may exclude at least one (e.g., the key input device 517 or the light emitting device 506) of the components or may add other components.

According to an embodiment of the disclosure, the display 501 may be exposed through, e.g., a majority portion of the front plate 502. According to an embodiment of the disclosure, at least a portion of the display 501 may be exposed through the front plate 502 forming the first surface 510A and the first areas 510D of the side surface 510C. According to an embodiment of the disclosure, the edge of the display 501 may be formed to be substantially the same in shape as an adjacent outer edge of the front plate 502. According to another embodiment (not shown), the interval between the outer edge of the display 501 and the outer edge of the front plate 502 may remain substantially even to give a larger area of exposure the display 501.

According to another embodiment (not shown), the screen display area of the display 501 may have a recess or opening in a portion thereof, and at least one or more of the audio module 514, sensor module 504, camera module 505, and light emitting device 506 may be aligned with the recess or opening. According to another embodiment (not shown), at least one or more of the audio module 514, sensor module 504, camera module 505, fingerprint sensor 516, and light emitting device 506 may be included on the rear surface of the screen display area of the display 501.

In another embodiment (not shown), the display 501 may include at least one of an audio module 514, a sensor module 504, a camera module 505, and a light emitting device 506 on the rear surface of the screen display area (e.g., the first surface 510A and the first areas 510D). For example, the electronic device 500 may have the camera module 505 disposed on the rear surface of at least one of the first surface 510A (e.g., the front surface) and/or the side surface 510C (e.g., the first area 510D) to face the first surface 510A and/or the side surface 510C. For example, the camera module 505 may include an under display camera (UDC) that is not exposed to the screen display area.

According to another embodiment (not shown) of the disclosure, the display 501 may be disposed to be coupled with, or adjacent, a touch detecting circuit, a pressure sensor capable of measuring the strength (pressure) of touches, and/or a digitizer for detecting a magnetic field-type stylus pen. In some embodiments of the disclosure, at least a portion of the sensor modules 504, 516, and 519, and/or at least a portion of the key input device 517 may be disposed in the first areas 510D and/or the second areas 510E.

In another embodiment (not shown) of the disclosure, the display 501 may include a display that is disposed to be slidable and provides a screen (e.g., a screen display area). For example, the screen display area of the electronic device 501 is an area that is visually exposed and enables an image to be output. The electronic device 500 may adjust the screen display area according to movement of a sliding plate (not shown) or movement of the display 501. For example, the electronic device 500 may include a rollable electronic device configured to selectively expand the screen display area as at least a portion (e.g., the housing) of the electronic device 500 is operated to be at least partially slidable. According to an embodiment of the disclosure, the display 501 may be referred to as a slide-out display or an expandable display.

According to an embodiment of the disclosure, the audio modules 503, 507, and 514 may include a microphone hole 503 and speaker holes 507 and 514. A microphone for acquiring external sounds may be disposed in the microphone hole 503. In some embodiments of the disclosure, a plurality of microphones may be disposed to detect the direction of the sound. The speaker holes 507 and 514 may include an external speaker hole 507 and a phone receiver hole 514. In some embodiments of the disclosure, the speaker holes 507 and 514 and the microphone hole 503 may be implemented as a single hole, or a speaker may be included without the speaker holes 507 and 514 (e.g., a piezo speaker).

According to an embodiment of the disclosure, the sensor modules 504, 516, and 519 may generate an electrical signal or data value corresponding to an internal operating state or external environmental state of the electronic device 500. The sensor modules 504, 516, and 519 may include a first sensor module 504 (e.g., a proximity sensor) disposed on the first surface 510A of the housing 510, and/or a second sensor module (not shown) (e.g., a fingerprint sensor), and/or a third sensor module 519 (e.g., a heart-rate monitor (HRM) sensor) disposed on the second surface 510B of the housing 510, and/or a fourth sensor module 516 (e.g., a fingerprint sensor). The fingerprint sensor may be disposed on the second surface 510B as well as the first surface 510A (e.g., the display 501) of the housing 510. The electronic device 500 may include a sensor module not shown, e.g., at least one of a gesture sensor, a gyro sensor, a barometric sensor, a magnetic sensor, an acceleration sensor, a grip sensor, a color sensor, an infrared (IR) sensor, a biometric sensor, a temperature sensor, a humidity sensor, or an illuminance sensor.

According to an embodiment of the disclosure, the camera modules 505 and 512 may include a first camera module 505 disposed on the first surface 510A of the electronic device 500 and a second camera module 512 and/or a flash 513 disposed on the second surface 510B. The camera modules 505 and 512 may include one or more lenses, an image sensor, and/or an image signal processor. The flash 513 may include, e.g., a light emitting diode (LED) or a xenon lamp. According to an embodiment of the disclosure, two or more lenses (an infrared (IR) camera, a wide-angle lens, and a telescopic lens) and image sensors may be disposed on one surface of the electronic device 500.

According to an embodiment of the disclosure, the key input device 517 may be disposed on the side surface 510C of the housing 510. According to another embodiment of the disclosure, the electronic device 500 may exclude all or some of the above-mentioned key input devices 517 and the excluded key input devices 517 may be implemented in other forms, e.g., as soft keys, on the display 501. According to an embodiment of the disclosure, the key input device may include the sensor module 516 disposed on the second surface 510B of the housing 510.

According to an embodiment of the disclosure, the light emitting device 506 may be disposed on the first surface 510A of the housing 510, for example. The light emitting device 506 may provide, e.g., information about the state of the electronic device 500 in the form of light. According to an embodiment of the disclosure, the light emitting device 506 may provide a light source that interacts with, e.g., the camera module 505. The light emitting device 506 may include, e.g., a light emitting diode (LED), an infrared (IR) LED, or a xenon lamp.

According to an embodiment of the disclosure, the connector holes 508 and 509 may include, e.g., a first connector hole 508 for receiving a connector (e.g., a universal serial bus (USB) connector) for transmitting or receiving power and/or data to/from an external electronic device and/or a second connector hole (e.g., an earphone jack) 509 for receiving a connector for transmitting or receiving audio signals to/from the external electronic device.

Figure 13:
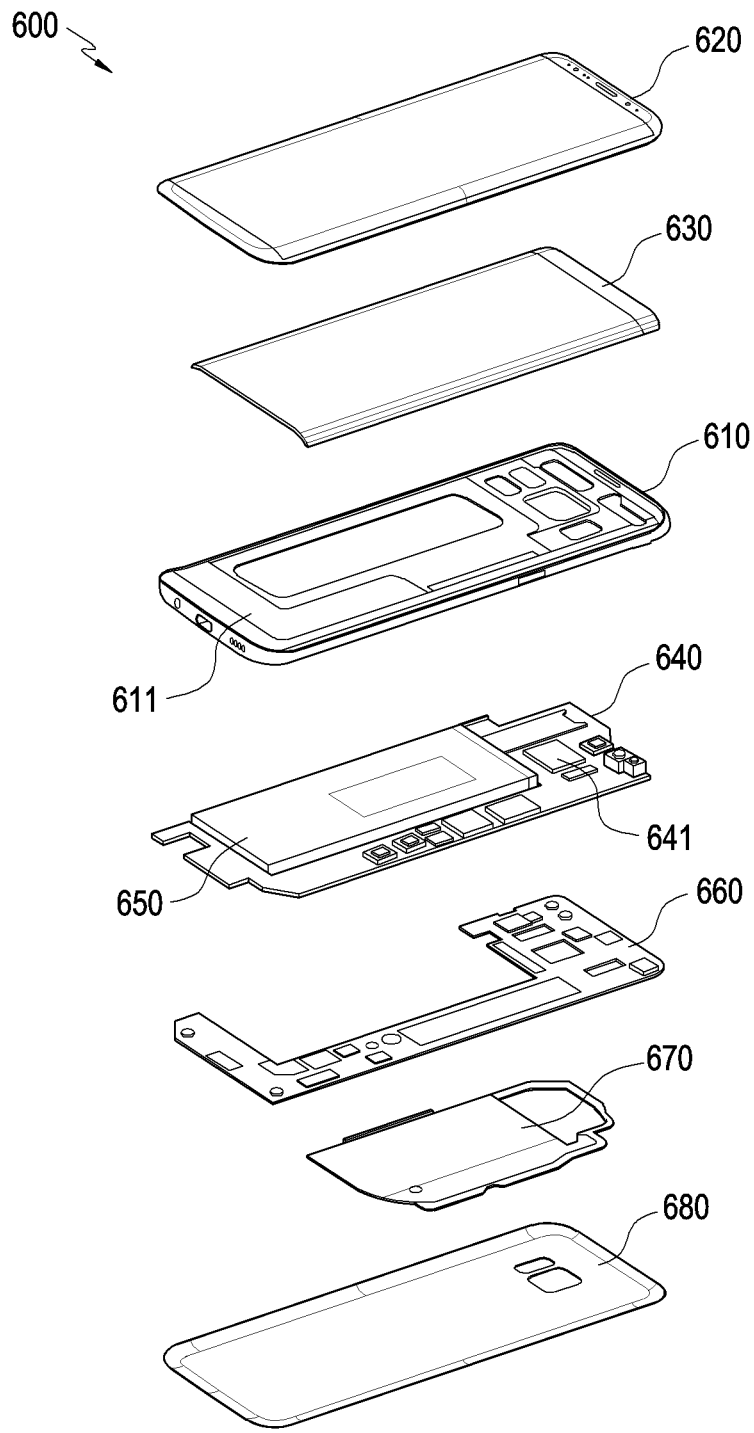
FIG. 13 is an exploded perspective view illustrating an electronic device of FIG. 11 according to an embodiment of the disclosure.

FIG. 13 is an exploded perspective view illustrating an electronic device of FIG. 11 according to an embodiment of the disclosure.

Referring to FIG. 13, an electronic device 600 may include a side structure 610, a first supporting member 611 (e.g., a bracket), a front plate 620, a display 630, a printed circuit board 640 (e.g., a printed circuit board (PCB), a printed board assembly (PBA), a flexible PCB (FPCB), or a rigid-flexible PCB (RFPCB)), a battery 650, a second supporting member 660 (e.g., a rear case), an antenna 670, and/or a rear plate 680. According to an embodiment of the disclosure, the electronic device 600 may exclude at least one (e.g., the first supporting member 611 or the second supporting member 660) of the components or may add other components. According to an embodiment (not shown), the electronic device 600 may include at least one hinge structure to thereby have a structure in which a housing split into a plurality of areas is folded. For example, according to a change in the state of the hinge structure (e.g., a folded state, an intermediate state, or an unfolded state), the state of the display operatively connected to the housing may change. For example, the first display corresponding to the first housing and the second display corresponding to the second housing may be changed to face each other or to be spaced apart from each other. According to an embodiment of the disclosure, at least one of the components of the electronic device 600 may be the same or similar to at least one of the components of the electronic device 500 of FIG. 11 or 12 and no duplicate description is made below.

According to an embodiment of the disclosure, the first supporting member 611 may be disposed inside the electronic device 600 to be connected with the side structure 610 or integrated with the side structure 610. The first supporting member 611 may be formed of, e.g., a metallic material and/or non-metallic material (e.g., polymer). In some embodiments of the disclosure, the first supporting member 611 may include a thermally conductive material, thereby receiving the heat generated from a heat generating component (e.g., the integrated circuit chip 641 equipped with a circuit device, such as a communication module or a processor) inside the electronic device and distributing the heat to a broader area or space. The display 630 may be joined onto one surface of the first supporting member 611, and the printed circuit board 640 may be joined onto the opposite surface of the first supporting member 611.

According to an embodiment of the disclosure, a processor, a memory, and/or an interface may be mounted on the printed circuit board 640. The processor may include one or more of, e.g., a central processing unit, an application processor, a graphic processing device, an image signal processing, a sensor hub processor, or a communication processor. In one embodiment of the disclosure, the processor or communication module may be mounted in the electronic component, such as the integrated circuit chip 641, and disposed on the printed circuit board 640.

According to an embodiment of the disclosure, the memory may include, e.g., a volatile or non-volatile memory.

According to an embodiment of the disclosure, the interface may include, for example, a high definition multimedia interface (HDMI), a universal serial bus (USB) interface, a secure digital (SD) card interface, and/or an audio interface. The interface may electrically or physically connect, e.g., the electronic device 600 with an external electronic device and may include a USB connector, an SD card/multimedia card (MMC) connector, or an audio connector.

According to an embodiment of the disclosure, the battery 650 may be a device for supplying power to at least one component of the electronic device 600. The battery 650 may include, e.g., a primary cell which is not rechargeable, a secondary cell which is rechargeable, or a fuel cell. At least a portion of the battery 650 may be disposed on substantially the same plane as the printed circuit board 640. The battery 650 may be integrally or detachably disposed inside the electronic device 600.

According to an embodiment of the disclosure, the antenna 670 may be disposed between the rear plate 680 and the battery 650. The antenna 670 may include, e.g., a near-field communication (NFC) antenna, a wireless charging antenna, and/or a magnetic secure transmission (MST) antenna. The antenna 670 may perform short-range communication with, e.g., an external device or may wirelessly transmit or receive power necessary for charging. According to an embodiment of the disclosure, an antenna structure may be formed by a portion or combination of the side structure 610 and/or the first supporting member 611.

According to various embodiments of the disclosure, the electronic module 400a or 400b of FIG. 5 to 7 or 9 may be disposed on the printed circuit board 640, and a contact member (e.g., the contact member 457a or 457b of FIG. 8 or 10) may be disposed on the antenna 670 (e.g., the antenna member 455 of FIG. 8). For example, the electronic devices 500 and 600 may have a wireless charging function by including the arrangement or connection structure of FIG. 8 or FIG. 10. In an embodiment of the disclosure, the electronic devices 500 and 600 of FIGS. 11 to 13 may have an enhanced design degree of freedom in arrangement of various components or electrical wiring on the printed circuit board 640 by placing a component (e.g., the electronic module 400a or 400b of FIG. 7 or 9) for providing a wireless charging function. It would be easily appreciated by one of ordinary skill in the art that the electronic device 500 or 600 may easily be downsized while having a wireless charging function through the arrangement or connection structure of FIG. 8 or 10.

As described above, according to various embodiments of the disclosure, an electronic device (e.g., the electronic device 101, 102, 104, 200, 300, 500, or 600 of FIGS. 1 to 4 and/or FIGS. 11 to 13) may comprise a first circuit board (e.g., the printed circuit board 380 or 640 of FIG. 4 or 13 and/or the first circuit board 480 of FIG. 8 or 10), an antenna member (e.g., the first antenna 350 of FIG. 4, the second antenna mounted on the auxiliary circuit board 355, the antenna member 455 of FIG. 8 or 10, and/or the antenna 670 of FIG. 13) disposed to face one surface of the first circuit board, an electronic module (e.g., the electronic module 400a or 400b of FIGS. 5 to 10) disposed between the first circuit board and the antenna member and including a plurality of contact protrusions (e.g., the contact protrusion 415 of FIGS. 5, 7, and/or 9) disposed to face the antenna member, and a plurality of contact members (e.g., the contact member 457a or 457b of FIGS. 8 and/or 10) disposed on the antenna member and configured to electrically contact one of the plurality of contact protrusions. As the antenna member generates an induced current in reaction to an external electrical signal or an external electromagnetic field, the electronic module may be configured to supply power using the induced current generated by the antenna member.

According to various embodiments of the disclosure, the electronic module may include a second circuit board (e.g., the baseboard 401 of FIGS. 5 to 10) including the contact protrusions protruding from one surface, a plurality of solder balls (e.g., the solder balls 413 of FIGS. 6 to 8 and/or 10) disposed on another surface of the second circuit board, and at least one electronic component (e.g., the electronic component 402 of FIGS. 5 to 7) disposed on at least one any one surface of the second circuit board. The solder balls may be configured to couple the second circuit board to the first circuit board and form an electrical connection between the first circuit board and the second circuit board.

According to various embodiments of the disclosure, the electronic component may include a wireless charging circuit (e.g., the power management module 188 of FIG. 1).

According to various embodiments of the disclosure, the electronic module may further include an insulating resin layer (e.g., the insulating resin layer 417a or 417b of FIGS. 5 to 10) applied to at least one surface of the second circuit board. A portion of the contact protrusions may be exposed to an outside of the insulating resin layer.

According to various embodiments of the disclosure, a distance (e.g., the distance or height denoted by 'g' in FIG. 7) between the first circuit board and the second circuit board may be smaller than a height (e.g., the first height denoted by 'h1' in FIG. 7) at which the contact protrusions protrude from the second circuit board.

According to various embodiments of the disclosure, the electronic component may be disposed on another surface of the second circuit board and may be disposed around an area where the solder balls are disposed in the electronic component.

According to various embodiments of the disclosure, the contact members may contact one of the contact protrusions along a direction (e.g., the Z-axis direction of FIG. 4 or the first thickness t1 direction of FIG. 8) in which the first circuit board and the antenna member face each other.

According to various embodiments of the disclosure, the contact members may contact one of the contact protrusions along a direction crossing a direction (e.g., the Z-axis direction of FIG. 4 or the second thickness t2 direction of FIG. 9) in which the first circuit board and the antenna member face each other.

According to various embodiments of the disclosure, the electronic device may further comprise a cover member (e.g., the rear plate 393 of FIG. 4, the cover member 493 of FIGS. 8 and 10, and/or the rear plate 680 of FIG. 13) disposed to face the first circuit board, with the antenna member positioned therebetween. The antenna member may be disposed on an inner surface of the cover member.

According to various embodiments of the disclosure, the electronic module may include a second circuit board including the contact protrusions protruding from one surface, at least one passive element (e.g., the first passive element 421b of FIG. 5) or at least one first integrated circuit chip (e.g., the first integrated circuit chip 421a of FIG. 5) disposed on one surface of the second circuit board, at least one second integrated circuit chip (e.g., the second integrated circuit chip 423a of FIG. 6) disposed on another surface of the second circuit board, a plurality of solder balls disposed around an area where the second integrated circuit chip is disposed, on the other surface of the second circuit board, and an insulating resin layer applied to two opposite surfaces of the second circuit board. At least one of the passive element, the first integrated circuit chip, or the second integrated circuit chip may be buried in the insulating resin layer, and a portion of the contact protrusions may be exposed to an outside of the insulating resin layer.

According to various embodiments of the disclosure, the solder balls may be configured to couple the second circuit board to the first circuit board and form an electrical connection between the first circuit board and the second circuit board.

According to various embodiments of the disclosure, an electronic device (e.g., the electronic device 101, 102, 104, 200, 300, 500, or 600 of FIGS. 1 to 4 and/or FIGS. 11 to 13) may comprise a housing (e.g., the housing 220 of FIG. 2), at least one wearing member (e.g., the wearing members 250 and 260 of FIGS. 2 to 4) extending from the housing and configured to enable the housing to be worn on a user's body, a battery (e.g., the battery 370 of FIG. 4) received in the housing, a first circuit board (e.g., the printed circuit board 380 of FIG. 4 and/or the first circuit board 480 of FIGS. 8 and 10) disposed between any one surface of the housing and the battery, an antenna member (e.g., the first antenna 350 of FIG. 4, the second antenna mounted on the auxiliary circuit board 355, and/or the antenna member 455 of FIGS. 8 and 10) disposed to face one surface of the first circuit board, an electronic module (e.g., the electronic module 400a or 400b of FIGS. 5 to 10) disposed between the first circuit board and the antenna member and including a plurality of contact protrusions (e.g., the contact protrusion 415 of FIGS. 5, 7, and/or 9) disposed to face the antenna member, and a plurality of contact members (e.g., the contact member 457a or 457b of FIGS. 8 and/or 10) disposed on the antenna member and configured to electrically contact one of the plurality of contact protrusions. As the antenna member generates an induced current in reaction to an external electrical signal or an external electromagnetic field, the electronic module may be configured to supply power or charge the battery (e.g., the battery 370 of FIG. 4) using the induced current generated by the antenna member.

According to various embodiments of the disclosure, the electronic device may further comprise a display (e.g., the display 320 of FIG. 4) disposed on one surface of the housing and configured to output a screen to a front surface of the electronic device and a rear plate (e.g., the rear plate 393 of FIG. 4 and/or the cover member 493 of FIGS. 8 and 10) disposed on another surface of the housing. The antenna member may be disposed on the rear plate.

According to various embodiments of the disclosure, the electronic module may include a second circuit board (e.g., the baseboard 401 of FIGS. 5 to 10) including the contact protrusions protruding from one surface, a plurality of solder balls (e.g., the solder balls 413 of FIGS. 6 to 8 and/or 10) disposed on another surface of the second circuit board, and at least one electronic component (e.g., the electronic component 402 of FIGS. 5 to 7) disposed on at least one any one surface of the second circuit board. The solder balls may be configured to couple the second circuit board to the first circuit board and form an electrical connection between the first circuit board and the second circuit board.

According to various embodiments of the disclosure, the electronic module may further include an insulating resin layer (e.g., the insulating resin layer 417a or 417b of FIGS. 5 to 10) applied to at least one surface of the second circuit board. A portion of the contact protrusions may be exposed to an outside of the insulating resin layer.

According to various embodiments of the disclosure, at least one of the first integrated circuit chip and the second integrated circuit chip may include a wireless charging circuit (e.g., the power management module 188 of FIG. 1).

According to various embodiments of the disclosure, a distance (e.g., the distance or height denoted by 'g' in FIG. 7) between the first circuit board and the second circuit board may be smaller than a height (e.g., the first height denoted by 'h1' in FIG. 7) at which the contact protrusions protrude from the second circuit board.

According to various embodiments of the disclosure, the electronic component may be disposed on another surface of the second circuit board and may be disposed around an area where the solder balls are disposed in the electronic component.

According to various embodiments of the disclosure, the contact members may contact one of the contact protrusions along a direction (e.g., the Z-axis direction of FIG. 4 or the first thickness t1 direction of FIG. 8) in which the first circuit board and the antenna member face each other.

According to various embodiments of the disclosure, the contact members may contact one of the contact protrusions along a direction crossing a direction (e.g., the Z-axis direction of FIG. 4 or the second thickness t2 direction of FIG. 9) in which the first circuit board and the antenna member face each other.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. An electronic device comprising:
   a first circuit board;
   at least one passive element or at least one integrated circuit chip including at least one of a processor, memory, and/or a communication module disposed on the first circuit board;
   an antenna member disposed to face one surface of the first circuit board;
   an electronic module disposed on the first circuit board and adjacent to the at least one passive element or the at least one integrated circuit chip, the electronic module being disposed between the first circuit board and the antenna member and including a plurality of contact protrusions disposed to face the antenna member; and
   a plurality of contact members disposed on the antenna member and configured to electrically contact one of the plurality of contact protrusions,
   wherein as the antenna member generates an induced current in reaction to an external electrical signal or an external electromagnetic field, the electronic module is configured to supply power using the induced current generated by the antenna member.

2. The electronic device of claim 1,
   wherein the electronic module includes:
      a second circuit board including the contact protrusions protruding from one surface;
      a plurality of solder balls disposed on another surface of the second circuit board; and
      at least one electronic component disposed on at least one any one surface of the second circuit board, and
   wherein the plurality of solder balls are configured to couple the second circuit board to the first circuit board and form an electrical connection between the first circuit board and the second circuit board.

3. The electronic device of claim 2, wherein the electronic component includes a wireless charging circuit.

4. The electronic device of claim 2,
   wherein the electronic module further includes an insulating resin layer applied to at least one surface of the second circuit board, and
   wherein a portion of the contact protrusions is exposed to an outside of the insulating resin layer.

5. The electronic device of claim 2, wherein a distance between the first circuit board and the second circuit board is smaller than a height at which the contact protrusions protrude from the second circuit board.

6. The electronic device of claim 2, wherein the electronic component is disposed on another surface of the second circuit board and is disposed around an area where the plurality of solder balls are disposed in the electronic component.

7. The electronic device of claim 1, wherein the contact members contact one of the contact protrusions along a direction in which the first circuit board and the antenna member face each other.

8. The electronic device of claim 1, wherein the contact members contact one of the contact protrusions along a direction crossing a direction in which the first circuit board and the antenna member face each other.

9. The electronic device of claim 1, further comprising:
   a cover member disposed to face the first circuit board, with the antenna member positioned therebetween,
   wherein the antenna member is disposed on an inner surface of the cover member.

10. The electronic device of claim 1,
   wherein the electronic module includes:
      a second circuit board including the contact protrusions protruding from one surface,
      at least one passive element or at least one first integrated circuit chip disposed on one surface of the second circuit board,
      at least one second integrated circuit chip disposed on another surface of the second circuit board,
      a plurality of solder balls disposed around an area where the second integrated circuit chip is disposed, on the other surface of the second circuit board, and
      an insulating resin layer applied to two opposite surfaces of the second circuit board, and
   wherein at least one of the passive element, the first integrated circuit chip, or the second integrated circuit chip is buried in the insulating resin layer, and a portion of the contact protrusions is exposed to an outside of the insulating resin layer.

11. The electronic device of claim 10, wherein the plurality of solder balls are configured to couple the second circuit board to the first circuit board and form an electrical connection between the first circuit board and the second circuit board.

12. An electronic device comprising:
   a housing;
   at least one wearing member extending from the housing and configured to enable the housing to be worn on a user's body;
   a battery received in the housing;
   a first circuit board disposed between any one surface of the housing and the battery;
   at least one passive element or at least one integrated circuit chip including at least one of a processor, a memory, and/or a communication module disposed on the first circuit board;
   an antenna member disposed to face one surface of the first circuit board;
   an electronic module disposed on the first circuit board and adjacent to the at least one passive element or the at least one integrated circuit chip, the electronic module being disposed between the first circuit board and the antenna member and including a plurality of contact protrusions disposed to face the antenna member; and a plurality of contact members disposed on the antenna member and configured to electrically contact one of the plurality of contact protrusions, wherein as the antenna member generates an induced current in reaction to an external electrical signal or an external electromagnetic field, the electronic module is configured to supply power or charge the battery using the induced current generated by the antenna member.

13. The electronic device of claim 12, further comprising:

a display disposed on one surface of the housing and configured to output a screen to a front surface of the electronic device; and a rear plate disposed on another surface of the housing, wherein the antenna member is disposed on the rear plate.

14. The electronic device of claim 12, wherein the electronic module includes:

a second circuit board including the contact protrusions protruding from one surface;

a plurality of solder balls disposed on another surface of the second circuit board; and at least one electronic component disposed on at least one any one surface of the second circuit board, and wherein the plurality of solder balls are configured to couple the second circuit board to the first circuit board and form an electrical connection between the first circuit board and the second circuit board.

15. The electronic device of claim 14, wherein the electronic module further includes an insulating resin layer applied to at least one surface of the second circuit board, and wherein a portion of the contact protrusions is exposed to an outside of the insulating resin layer.

16. The electronic device of claim 14, wherein the electronic module further includes:

at least one passive element or at least one first integrated circuit chip disposed on one surface of the second circuit board; and at least one second integrated circuit chip disposed on another surface of the second circuit board, and wherein at least one of the first integrated circuit chip and the second integrated circuit chip includes a wireless charging circuit.

17. The electronic device of claim 14, wherein a distance between the first circuit board and the second circuit board is smaller than a height at which the contact protrusions protrude from the second circuit board.

18. The electronic device of claim 14, wherein the electronic component is disposed on another surface of the second circuit board and is disposed around an area where the plurality of solder balls are disposed in the electronic component.

19. The electronic device of claim 12, wherein the contact members contact one of the contact protrusions along a direction in which the first circuit board and the antenna member face each other.

20. The electronic device of claim 12, wherein the contact members contact one of the contact protrusions along a direction crossing a direction in which the first circuit board and the antenna member face each other.

* * * * *